United States Patent [19]

Alpha et al.

[11] 4,180,618

[45] Dec. 25, 1979

[54] THIN SILICON FILM ELECTRONIC DEVICE

[75] Inventors: James W. Alpha, Corning; William H. Dumbaugh, Jr., Painted Post, both of N.Y.

[73] Assignee: Corning Glass Works, Corning, N.Y.

[21] Appl. No.: 819,264

[22] Filed: Jul. 27, 1977

[51] Int. Cl.$^2$ .................. B32B 17/06; B05D 5/12
[52] U.S. Cl. .................. 428/428; 428/446; 136/89 SG; 427/74; 427/85; 427/255; 106/52; 148/174; 148/175
[58] Field of Search .................. 427/85, 74, 255; 148/174, 175, 505; 106/52; 136/89 SG; 428/446, 428

[56] References Cited

U.S. PATENT DOCUMENTS

| | | | |
|---|---|---|---|
| 3,414,434 | 12/1968 | Manasevit | 427/85 |
| 3,484,311 | 12/1969 | Benzing | 427/85 |
| 3,508,962 | 4/1970 | Manasevit et al. | 427/85 |
| 3,564,358 | 2/1971 | Hähnlein | 148/174 |
| 3,990,914 | 11/1976 | Weinstein | 136/89 |
| 4,012,263 | 3/1977 | Shell | 106/52 |
| 4,060,423 | 11/1977 | Thomas | 106/52 |

OTHER PUBLICATIONS

Tung, Deposition & Physical Properties of Aluminosilicate Films, J. Electrochem. Soc., Solid State Science, vol. 117, No. 1 (Pp. 91-94)(1-1970).

*Primary Examiner*—Michael F. Esposito
*Attorney, Agent, or Firm*—Clarence R. Patty, Jr.; Clinton S. Janes, Jr.

[57] ABSTRACT

The present invention is related to the fabrication of electronic devices wherein a thin film of silicon is deposited upon a substrate. More particularly, the invention is directed to such devices wherein the substrate therefor is an alkaline earth metal aluminosilicate glass consisting essentially, by weight, of about 55-75% $SiO_2$, 5-25% $Al_2O_3$, and at least one alkaline earth metal oxide selected from the group consisting of 9-15% CaO, 14-20% SrO, 18-26% BaO, and mixtures thereof in a total amount equivalent on a molar basis to 9-15% CaO.

6 Claims, 1 Drawing Figure

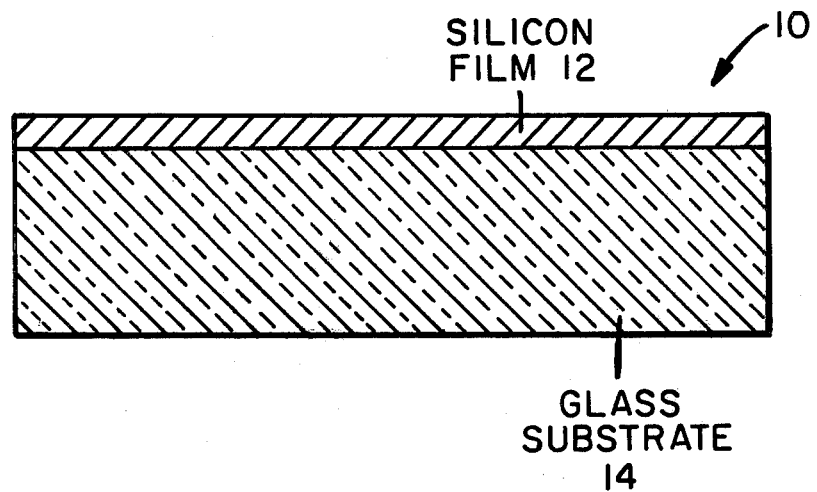

THIN SILICON FILM ELECTRONIC DEVICE

BACKGROUND OF THE INVENTION

Surface layers or zones of silicon, when doped with such materials as phosphorus or boron, produce areas of differing electron population commonly referred to as p and n layers. The familiar p-n junctions between such layers or zones form the basis of many well known semiconductor devices. Recently, efforts have been initiated to utilize this silicon technology in the production of photovoltaic devices known as solar cells. Such cells are activated by solar radiation to generate electrical energy, thereby providing a means of converting solar energy into electrical energy.

Silicon base semiconductor devices have generally been very small in size with primary emphasis being placed on electrical performance and miniaturization of the device. Accordingly, while reduction in material cost is rarely ever ignored, this economic factor has received relatively little consideration in the production of semiconductors.

Currently, however, the successful development of an operative solar cell based on doped layers of silicon promises to require a much larger structure wherein material cost will be a controlling factor. Accordingly, attention is being directed to photovoltaic devices wherein a thin silicon film is deposited on a substrate that is less expensive to produce than silicon. Such a substrate must of course be chemically, electrically, and physically compatible with silicon to produce an operable device. However, subject to this basic requirement, a low substrate cost, without additional film forming or processing costs, is now becoming a prime consideration. Specifically, it would be most desirable to provide a substrate material that is substantially less expensive than silicon itself, the primary substrate presently used in semiconductor devices and integrated circuitry.

A major factor contributing to material cost is the cost of forming the material into a relatively large body, more especially in the form of a sheet. Only a few materials have the potential of being inexpensively formed in this manner as well as the potential of compatibility with a silicon film. These materials include glasses, glass-ceramics, and polycrystalline ceramics such as sintered alumina.

Various methods are disclosed in the prior art for producing thin silicon films on the order of 20 to 100 microns in thickness. Such methods are directed to depositing the film as a separate entity on a substrate, rather than the doping of an integral surface layer on a body of silicon as is the common semiconductor commercial practice.

In accordance with a method of particular interest, the vapor of a silicon compound such as silicon hydride (SiH$_4$) is pyrolyzed in contact with a substrate material while at a temperature in the range of 700°–1300° C. to produce silicon which is deposited as a film on the substrate.

It is vitally necessary that the substrate material employed be chemically, electrically and physically compatible with the silicon film deposited thereon, as well as chemically inert with respect to the materials used in the process. It is particularly important that the linear thermal expansion coefficient of the substrate material closely match that of silicon over the entire temperature range from the deposition temperature down to room temperature. Otherwise, warping of the substrate and/or development of stresses in the silicon film tend to occur and produce subsequent erratic electrical behavior in the device being produced.

It is obvious that there should be no reaction between the silicon film being produced and the substrate surface upon which it is being deposited. It is also necessary that other materials employed in the process, in particular the silicon compound, the products of decomposition, and the carrier gas, should be chemically unreactive with the substrate. Finally, there should be no inherent or induced crystallization tendencies in the substrate material which would tend to effect the uniformity of the silicon film.

PRIOR ART

U.S. Pat. No. 3,484,311, granted Dec. 16, 1969 to W. C. Benzing, describes a process for forming a uniform, continuous coating of polycrystalline silicon upon an inert substrate in which the substrate is contacted with a mixture of hydrogen and silane (SiH$_4$) at a temperature in the range of 700°–1300° C. As inert materials, reference is made to a smooth glassy silicon dioxide surface, as well as quartz, alumina, porcelain and similar materials. The patent refers to doping the growing silicon film with boron, phosphorus, or arsenic. A vapor deposition process, with the option of including doping materials, is also disclosed in detail in U.S. Pat. No. 3,173,814, granted Mar. 16, 1965 to J. T. Law.

U.S. Pat. No. 3,414,434, granted Dec. 3, 1968 to H. M. Manasevit, describes a silicon film on a spinel substrate and refers to a publication in the Journal of Applied Physics (Vol. 35, No. 4, pp. 1349–1351, April 1964) which describes such a film on a sapphire substrate. U.S. Pat. No. 4,012,263, granted Mar. 15, 1977, describes a family of alkaline earth aluminosilicate glasses as encapsulating glasses for semiconductor devices. Glasses of this general type are also well known for such other uses as vapor lamp envelopes.

SUMMARY OF THE INVENTION

The present invention is an electronic device consisting of a thin film of silicon deposited on a substrate of an alkaline earth aluminosilicate glass, the glass consisting essentially of, in percent by weight as calculated from the glass batch on an oxide basis, 55 to 75% SiO$_2$, 5 to 25% Al$_2$O$_3$ and at least one alkaline earth metal oxide selected from the group consisting of 9 to 15% CaO, 14–20% SrO, 18 to 26% BaO, and mixtures of two or more of these oxides wherein the total alkaline earth metal oxide content is equivalent on a molar basis to 9 to 15% CaO. Thus, the invention contemplates an improved substrate in a thin film silicon electronic device. It further contemplates a method of producing such a device wherein the vapor of a silicon compound is pyrolyzed in the presence of such a substrate at a temperature in the range of 700°–1000° C. to deposit a film of silicon on the substrate surface, the thickness of said film preferably being on the order of 20 to 100 microns.

DESCRIPTION OF THE FIGURE

The FIGURE accompanying the present application, submitted as an aid in understanding the invention thereof, is a single FIGURE showing in cross section a typical photovoltaic device produced in accordance with the invention.

GENERAL DESCRIPTION

In the FIGURE, a photovoltaic device 10 is shown in cross section composed of a silicon film 12 deposited on a glass substrate 14. A completed device, such as a solar cell, will of course also have electrical contacts to the silicon film and, optionally, a supporting structure, both omitted here for simplicity. Further, the device may take the form of a relatively large sheet, or may comprise a bank of smaller units.

Silicon film 12 is preferably on the order of 20 to 100 microns in thickness and is formed on the surface of a glass substrate produced in a separate forming operation. As explained later, a particular feature of the present invention is the provision of a glass that may be readily drawn in sheet form for this purpose. The dimensions of the sheet are not a critical part of the invention. Thus, while 6" squares have been found convenient for testing purposes, it is contemplated that considerably larger sizes will be employed in production. Further, it is contemplated that the operation may be continuous so that a silicon film is continuously deposited on a moving sheet of glass.

As pointed out earlier, various processes of depositing silicon films are known in the art. The silicon filmed element of the invention may be formed in accordance with any of these known methods, and is not limited to any specific technique for the deposition of silicon.

In accordance with a preferred embodiment of the invention, however, a preformed glass substrate 14 is placed in, or moved through, a silicon deposition chamber while maintained at a temperature in the range of at least about 700° C., but below the deformation temperature of the substrate. The vapor of a suitable silicon compound is then introduced into the chamber and pyrolyzed while in contact with the glass substrate to produce silicon which is deposited in film form on the substrate surface. The silicon compound may be one of a variety of halide compounds known for the purpose. The selected vapor may be carried into the pyrolysis chamber by a carrier gas which may be either helium or hydrogen. The former is generally preferred because hydrogen may be reactive with certain glass surfaces.

The minimum temperature of 700° C. in the pyrolysis temperature range is based on the consideration that film formation does not occur in a desired manner below that temperature. In general, preferred silicon crystal arrangements for energy conversion are attained at higher temperatures. However, temperatures above which the glass substrate tends to soften and deform, thus becoming unsuitable for film disposition, are obviously not useful. A temperature of about 1000° C. has been found to constitute a practical maximum.

The critical element in the photovoltaic device of the invention is glass substrate 14. From a technical or operating standpoint, this substrate must be chemically, electrically, and physically compatible with the silicon film both during film formation and during subsequent operation of the device. Moreover, the glass substrate must not react with any of the materials coming in contact with it including the vapor, the carrier gas for the vapor, or the products of decomposition. Further, the glass surface must not undergo any incipient crystallization during the film processing. Any alteration of the substrate surface, as by either chemical reaction or crystallization, tends to cause deposition of the silicon film in a nonuniform manner with consequent erratic properties.

In addition to chemical compatibility, it is most important that the linear thermal expansion coefficient of the glass closely match that of the silicon film over the temperature range between the film deposition temperature and room temperature. Otherwise, uneven contraction between the film and substrate during cooling will induce strains in the silicon film, and may cause warping in the substrate or cracking in the film. Such untoward physical effects render the electrical characteristics of the film erratic and unpredictable. For a reasonable match with silicon, the linear thermal expansion coefficient of the substrate should be within the range of 32 to $42 \times 10^{-7}/°C.$ over the temperature range of 0°–300° C.

As indicated earlier, a preferred crystal arrangement in the silicon film occurs at higher deposition temperatures. Hence, it is desirable that the substrate glass be adapted to withstand as high a deposition temperature as possible without deformation. To this end, the glass substrate should have an annealing temperature over 800° C.

A most effective means of reducing substrate cost is to provide a glass that lends itself to being drawn in sheet form without crystallization occuring during the drawing process. To this end, the selected glass should have a low liquidus temperature, and consequently a high viscosity at the liquidus temperature. Specifically, glasses are preferred wherein the viscosity at the liquidus temperature is on the order of 100,000 or higher.

In accordance with our invention then, we provide an aluminosilicate glass substrate which, in percent by weight as calculated from the glass batch on an oxide basis, consists essentially of 55 to 75% $SiO_2$, 5 to 25% $Al_2O_3$ and at least one alkaline earth metal oxide selected from the group consisting of 9 to 15% CaO, 14 to 20% SrO, 18 to 26% BaO, and mixtures of such oxides in a total amount equivalent on a molar basis to 9 to 15% CaO. While minor amounts of other oxides may be tolerated on occasion, it is generally desirable to limit the substrate compositions to the oxides and proportions indicated above. Thus, the presence of substantial amounts of alkali metal oxide tend to create alkali rich surfaces that are not electrically compatible. Substitution of magnesia for the other alkaline earth metal oxides tends to lower the expansion coefficient to an undesirable extent. The presence of boric oxide tends to adversely affect the liquidus viscosity characteristics of the glass, as well as unduly soften it.

In the interest of attaining a high liquidus viscosity on the order of 100,000 poises, we have found that it is preferable to employ a combination of at least two alkaline earth metal oxides in the glass composition, and it is further preferable that one of these be barium oxide.

SPECIFIC EMBODIMENTS

Table I sets forth, in terms of oxide proportions, two series of glass compositions. These two series are especially formulated to illustrate the criticality in selecting not only the proper alkaline earth oxides for purposes of the invention, but also the proper proportions of the oxide, or oxides, chosen. The compositions in one series (examples 1–4) correspond to one another on a molar basis, except that each composition contains a different alkaline earth metal oxide in the amount of ten mole percent. The compositions in the second series (examples 5–8) also differ only in the alkaline earth metal oxide selected, but, in this case, the proportion is fifteen (15) mole percent. The glass compositions are calculated on the basis of their batches and are given in both weight and mole percent for ease of comparison.

the base glass composition was otherwise maintained constant on a molar basis. The base glass composition,

TABLE I

|  | 1 | | 2 | | 3 | | 4 | | 5 | | 6 | | 7 | | 8 | |
| --- | --- | --- | --- | --- | --- | --- | --- | --- | --- | --- | --- | --- | --- | --- | --- | --- |
|  | mole | wt. | mole | wt. | mole | wt. | mole | wt. | mole | wt. | mole | wt. | mole | wt. | mole | wt. |
| $SiO_2$ | 70 | 63.2 | 70 | 61.8 | 70 | 57.7 | 70 | 54.0 | 70 | 66.2 | 70 | 63.9 | 70 | 57.7 | 70 | 52.2 |
| $Al_2O_3$ | 20 | 30.7 | 20 | 30.0 | 20 | 28.1 | 20 | 26.3 | 15 | 24.2 | 15 | 23.3 | 15 | 21.0 | 15 | 19.1 |
| MgO | 10 | 6.1 | — | — | — | — | — | — | 15 | 9.6 | — | — | — | — | — | — |
| CaO | — | — | 10 | 8.2 | — | — | — | — | — | — | 15 | 12.8 | — | — | — | — |
| SrO | — | — | — | — | 10 | 14.2 | — | — | — | — | — | — | 15 | 21.3 | — | — |
| BaO | — | — | — | — | — | — | 10 | 19.7 | — | — | — | — | — | — | 15 | 28.7 |
| Exp. Coef. $\times 10^7/°C.$ | 24.5 | | 30 | | 32 | | 33 | | 28 | | 39 | | 43 | | 48 | |
| Ann. Pt. °C. | 848 | | 860 | | 865 | | 868 | | 813 | | 852 | | 875 | | 880 | |

Batches for the present glasses, as well as glasses corresponding on the oxide basis but having proportions outside the claimed ranges, may be mixed from conventional materials, as for example alkaline earth metal carbonates, alumina and sand. A fining agent may be provided if desired.

Glass batches corresponding to the compositions of Table I were so prepared and electrically melted at 1600° C. The molten glasses thus produuced were cast and pressed into flat patties which were then annealed and cut into sections for measurement of various physical properties. Among the properties measured that are particularly relevant to the present invention are annealing point and linear coefficient of thermal expansion. These are set forth for each glass in Table I.

Examples 1 and 5 of Table I demonstrate the rather sharp decrease in thermal coefficient of expansion that occurs when MgO is substituted as the alkaline earth metal oxide component in the present glasses. This illustrates the undesirability of this oxide for purposes of the invention. Examples 1 and 5 also demonstrate the adverse effect of MgO on the annealing temperature of the glass. Hence while minor amounts of MgO might be tolerated in some glasses, its general effect is adverse to present purposes.

It will be observed that the CaO content of example 2 is slightly below the permitted minimum of 9% by weight, as is the thermal coefficient of expansion. In contrast, the slightly higher than minimum SrO and BaO contents of examples 3 and 4 provide expansion coefficients barely within the desired range. However, as shown in examples 6, 7 and 8, an increase in anyone of these oxides increases the expansion coefficient markedly. As a result, examples 7 and 8, which are high in SrO and BaO contents, respectively, demonstrate expansion coefficients somewhat higher than desired.

It is noted earlier that liquidus temperature, and consequent viscosity at the liquidus, are very significant factors in determining the capability of a glass to be drawn in sheet form by conventional glass fabricating procedures. Accordingly, starting with a basic $CaO$—$Al_2O_3$—$SiO_2$ glass composition, several series of compositions were formulated, and corresponding glasses melted, wherein small progressive changes were made between alkaline earth metal oxide contents while in mole percent, was 11.3% CaO, 12.6% $Al_2O_3$ and 76.1% $SiO_2$, which corresponds, in weight percent, to 9.8% CaO, 19.8% $Al_2O_3$ and 70.4% $SiO_2$. The alkaline earth metal oxide changes made therein, in mole percent, are set forth in Table II, each such change resulting in a new glass which was melted and properties measured as indicated. The linear expansion coefficient $\times 10^{-7}/°C.$ is given for the range of 25°–300° C., the viscosity at the liquidus is given in poises, and the liquidus and annealing point are given in °C.

TABLE II

| Example No. | Substitution (molar) | Exp. Coef. $\times 10^{-7}/°C.$ | Ann. Pt. °C. | Liq. °C. | Visc. at Liq. poises |
| --- | --- | --- | --- | --- | --- |
| 9 | base | 33 | 883 | 1355 | $4.2 \times 10^4$ |
| 10 | 2 MgO for 2 CaO | 30 | 862 | 1363 | $3.7 \times 10^4$ |
| 11 | 2 SrO for 2 CaO | 33.5 | 870 | 1332 | $8.5 \times 10^4$ |
| 12 | 6 SrO for 6 CaO | 34 | 874 | 1348 | $9.2 \times 10^4$ |
| 13 | 2 BaO for 2 CaO | 33.5 | 876 | 1328 | $1 \times 10^5$ |
| 14 | 4 BaO for 4 CaO | 34 | 875 | 1281 | $4 \times 10^5$ |
| 15 | 6 BaO for 6 CaO | 34.5 | 876 | 1357 | $1.1 \times 10^5$ |

It is again noted that substitution of magnesia (MgO) has a rather srong depressing effect on both the coefficient of expansion and the annealing temperature of the base glass, but has little effect on liquidus. In contrast, the substitution of BaO for CaO, and the substitution of SrO for CaO to a lesser extent, have a marked effect on liquidus values of the base glass, but have only a small positive effect on either expansion coefficient or annealing point in these mixed glasses. In view of these surprising effects, a mixed alkaline earth metal oxide glass, and especially one containing BaO, is preferred. Presently, Example 14 in Table II is considered the most preferred embodiment of the invention.

By way of further illustrating the unique characteristics of the present glasses for purposes of silicon film deposition, tests were conducted on four different glasses, the compositions and properties of which are shown in Table III. Glasses A, B, and C are commercially available glasses, whereas Glass D corresponds to example 14 of Table II. The glass compositions, as usual, are in weight percent on an oxide basis as calculated from the glass batch.

TABLE III

|  | A | B | C | D |
| --- | --- | --- | --- | --- |
| $SiO_2$ | 50 | 58 | 66 | 66 |
| $Al_2O_3$ | 10 | 15 | 23 | 19 |
| $B_2O_3$ | 15 | 4 | — | — |
| BaO | 25 | 6 | — | 9 |
| CaO | — | 10 | 11 | 6 |
| MgO | — | 7 | — | — |
| Exp. (0°–300° C.), $\times 10^7/°C.$ | 47 | 46 | 35 | 34 |
| Soft. Pt., °C. | 842 | 908 | 1060 | |
| Ann. Pt., °C. | 651 | 712 | 866 | 875 |

TABLE III-continued

|  | A | B | C | D |
|---|---|---|---|---|
| Liquidus, °C. | 940 | 1114 | 1350 | 1281 |
| Liq. Viscosity, poises | 1 × 10$^6$ | 3.8 × 10$^4$ | 2.6 × 10$^4$ | 4 × 10$^5$ |

Small plates of each glass were ground and polished to provide physically suitable substrates for the deposition of silicon by the pyrolysis of silane as described earlier.

Glass A was placed in a pyrolysis chamber at a temperature of 700° C. and exposed for 25 minutes to an atmosphere composed of silane and helium as a carrier gas. The silane was introduced at 25 cc per minute and helium at a rate of six liters per minute. This resulted in a silicon film being formed on the glass, but the composite was badly bowed indicating incompatibility of this glass in the silicon deposition process. Accordingly, no effort was made to study film quality or properties on this sample.

Glass B was placed in the same pyrolysis chamber with the atmosphere provided by similar flows of hydrogen as a carrier gas and silane. In this case, the chamber was operated at 850° C., a temperature about 60° C. below the glass softening point of 908° C. The glass substrate was about 750 micrometers thick and deposition was continued until a 17 micrometer film of silicon was grown thereon. When the sample was cooled, it was observed to be bowed somewhat and the silicon film appeared to have a wormy structure indicating contamination. The test was repeated with helium as the carrier gas, but the results were not substantially improved.

Glass C was exposed to a silane pyrolysis in similar manner with hydrogen as the carrier gas and at a temperature of 860° C. The film thus produced contained whiskers and appeared contaminated. Accordingly, the test was repeated with helium as a carrier gas and a visually good quality silicon film was produced. This procedure was then repeated at four different deposition temperatures with these results:

| Temp. °C. | Time (mins.) | Film Thickness (μm) |
|---|---|---|
| 860° C. | 10 | 6 |
| 915° C. | 10 | 14 |
| 955° C. | 15 | 16 |
| 1000° C. | 20 | 20 |

It was observed that crystal structure and physical properties in the films varied thus indicating the possibility of tailoring a film to satisfy a prescribed standard.

Glass C thus indicated the capability of producing a compatible film-substrate composite having desired electronic properties for either photovoltaic or semiconductor devices. However, the viscosity of this glass at its liquidus is only 26,000 poises. Consequently, it would be very difficult to produce large sheets of this glass by any conventional procedure, and this would seriously limit its use.

Glass D, as shown earlier, has a liquidus viscosity of 100,000 poises, and hence would present no problems in the drawing of large glass sheets. Tests similar to those performed on glass C indicated that a device produced with glass D as a substrate would provide excellent compatibility between the glass and silicon, as evidenced by desirable and consistent properties.

The invention has been described with reference to a photovoltaic device of present interest. However, its applicability to semiconductor devices, integrated circuitry and the like is believed obvious, and is contemplated by the term "electronic device". It is also contemplated that doped silicon films may be used, and this also is intended to be encompassed by the term "silicon film".

We claim:

1. In an electronic device wherein a thin film of silicon is deposited on a substrate, the improvement wherein the substrate is an aluminosilicate glass having a linear coefficient of thermal expansion over the temperature range of 0°–300° C. of between 32–42×10$^{-7}$/°C., an annealing temperature in excess of 800° C., and a viscosity at the liquidus temperature of at least about 100,000 poises, said glass consisting essentially, in percent by weight as calculated from the glass batch on an oxide basis, of 55 to 75% $SiO_2$, 5 to 25% $Al_2O_3$, and at least one alkaline earth metal oxide selected from the group consisting of 9 to 15% CaO, 14 to 20% SrO, 18 to 26% BaO, and a mixture of such oxides wherein the total alkaline earth metal oxide content is equivalent on a molar basis to 9 to 15% CaO.

2. A device in accordance with claim 1 wherein the substrate glass contains a mixture of alkaline earth metal oxides and BaO is part of such mixture.

3. A device in accordance with claim 1 wherein the substrate glass is composed approximately of 66% $SiO_2$, 19% $Al_2O_3$, 9% BaO and 6% CaO by weight.

4. A photovoltaic device in accordance with claim 1 wherein the substrate is in sheet form.

5. In a method of forming a photovoltaic device wherein a thin film of silicon is deposited on a substrate from a pyrolyzed vapor of a silicon compound, the improvement which comprises depositing the silicon on a substrate of aluminosilicate glass, the silicon being deposited at a temperature in excess of 700° C. but below the deformation temperature of the glass, the aluminosilicate glass having a linear coefficient of thermal expansion over the temperature range of 0°–300° C. of between 32–42×10$^{-7}$/°C., an annealing temperature in excess of 800° C., a viscosity at the liquidus temperature of at least about 100,000 poises, and consisting essentially of, in percent by weight as calculated from the glass batch on an oxide basis, 55 to 75% $SiO_2$, 5 to 25% $Al_2O_3$, and at least one alkaline earth metal oxide selected from the group consisting of 9 to 15% CaO, 14 to 20% SrO, 18 to 26% BaO, an a mixture of such alkaline earth metal oxides wherein the total alkaline earth metal oxide content is equivalent on a molar basis to 9 to 15% CaO.

6. A method according to claim 5 wherein said silicon is deposited at a temperature between about 700°–1000° C.

* * * * *